(12) United States Patent
Haick et al.

(10) Patent No.: US 10,704,965 B2
(45) Date of Patent: Jul. 7, 2020

(54) HIGH RESOLUTION PRESSURE SENSING

(71) Applicant: TECHNION RESEARCH & DEVELOPMENT FOUNDATION LTD., Haifa (IL)

(72) Inventors: Hossam Haick, Haifa (IL); Meital Segev-Bar, Haifa (IL); Gady Konvalina, Haifa (IL)

(73) Assignee: TECHNION RESEARCH & DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 15/534,122

(22) PCT Filed: Dec. 9, 2015

(86) PCT No.: PCT/IB2015/059492
§ 371 (c)(1),
(2) Date: Jun. 8, 2017

(87) PCT Pub. No.: WO2016/092494
PCT Pub. Date: Jun. 16, 2016

(65) Prior Publication Data
US 2017/0363489 A1  Dec. 21, 2017

Related U.S. Application Data

(60) Provisional application No. 62/089,268, filed on Dec. 9, 2014.

(51) Int. Cl.
*G01L 5/00* (2006.01)
*G01L 1/18* (2006.01)
(Continued)

(52) U.S. Cl.
CPC .............. *G01L 1/18* (2013.01); *G01L 1/16* (2013.01); *G01L 1/205* (2013.01); *G01L 1/2287* (2013.01);
(Continued)

(58) Field of Classification Search
CPC ... G01L 1/18; G01L 1/16; G01L 1/205; G01L 1/2287; G01L 5/22; G01L 5/226; G01L 5/228; H01L 41/1132
(Continued)

(56) References Cited

U.S. PATENT DOCUMENTS 7,116,209 B2   10/2006   Hermann et al.
8,448,530 B2    5/2013   Leuenberger et al.
(Continued)

OTHER PUBLICATIONS

J.Herrmann, K.-H.Muler, T.Reda, G.R. Baxter, B.Raguse, G.J.J. de Groot, R.Chai, M.Roberts, and L. Wieczorek, Nanoparticle films as sensitive strain gauges, Applied Physics Letters 91, 183105 (2007).
(Continued)

*Primary Examiner* — Max H Noori
(74) *Attorney, Agent, or Firm* — Roach, Brown, McCarthy & Gruber, P.C.; Kevin D. McCarthy

(57) ABSTRACT

A pressure sensing device that may include a first and second sensing elements that include one or more piezoresistive materials. The first sensing element has a first gradient. The second sensing element has a second gradient. The second gradient differs from the first gradient. The first and second gradients facilitate a determination of a magnitude of and/or a location of pressure applied on the first and second sensing element.

19 Claims, 22 Drawing Sheets

(51) Int. Cl.
*G01L 1/20* (2006.01)
*G01L 5/22* (2006.01)
*G01L 1/22* (2006.01)
*G01L 1/16* (2006.01)
*H01L 41/113* (2006.01)

(52) U.S. Cl.
CPC ............... *G01L 5/22* (2013.01); *G01L 5/226* (2013.01); *G01L 5/228* (2013.01); *H01L 41/1132* (2013.01)

(58) Field of Classification Search
USPC ...................................................... 73/862.68
See application file for complete search history.

(56) References Cited

U.S. PATENT DOCUMENTS

| 8,943,897 | B2 | 2/2015 | Beauvais | |
| 9,188,675 | B2* | 11/2015 | Bulea | H03K 17/955 |
| 2013/0059758 | A1* | 3/2013 | Haick | G01N 33/497 506/12 |
| 2013/0204157 | A1 | 8/2013 | Clark et al. | |
| 2013/0253863 | A1 | 9/2013 | Bulea | |
| 2013/0313880 | A1 | 11/2013 | Shamoto | |
| 2014/0007705 | A1 | 1/2014 | Campbell et al. | |
| 2015/0301021 | A1* | 10/2015 | Haick | A61B 5/082 205/777.5 |

OTHER PUBLICATIONS

International Search Report of PCT/IB2015/059492 Completed Mar. 16, 2016; dated Apr. 3, 2016 2 Pages.
Written Opinion of PCT/IB2015/059492 Completed Mar. 16, 2016; dated Apr. 3, 2016 4 Pages.
Search report of EPO of EP15867259 dated Jul. 19, 2018.

* cited by examiner

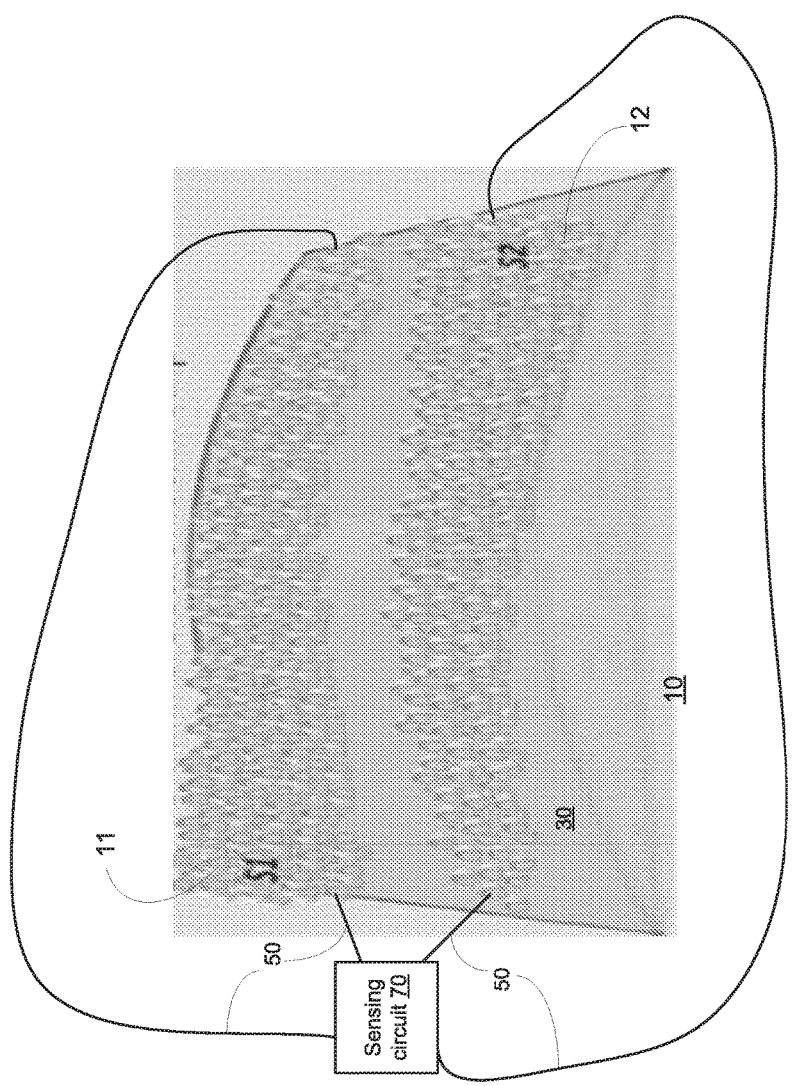

HIGH RESOLUTION PRESSURE SENSING

CROSS REFERENCE TO RELATED APPLICATIONS

This application is national phase application of PCT/IB2015/059492 filed on Dec. 9, 2015, which claims priority to U.S. provisional patent Ser. No. 62/089,268 filed Dec. 9, 2014. The disclosure of all applications are incorporated by reference in their entirety.

BACKGROUND

Smart patches, such as electronic skin (e-skin), are pixelated flexible sensing array, which senses external and environmental stimuli, in a manner similar to human skin. Smart patches has been produced from diverse technologies, such as semiconducting organics, nanowires, carbon nanotubes, and nanofibres.

Although promising results have been achieved with these technologies, the multi-pixel integration, complicated wiring, applied voltage, and analysis remain challenges to overcome. For example, 10×10 pixelated smart patch requires 200-300 wiring devices and 100 electrical measurement devices, thus increasing the energy consumption and the smart patch cost.

In general, the electrical resistance of GNP film depends on the inter-particle distance. When a GNP film is deposited on a flexible substrate, deformation of the substrate affects the inter-particle distance in the film and the resistance changes accordingly.

A schematic representation of GNPs on an elastically deformed flexible substrate is depicted in FIG. 1A. However, for smart patches applications, many pixels and associated wiring are required. In a pixelated array of strain/pressure sensors, the resolution is limited by the pixel size, and sensitivity differences between pixels might reduce the overall pressure resolution and detection limit.

SUMMARY

According to various embodiments of the invention there may be provided a pressure sensing device and/or a method for activating the pressure sensing device.

According to various embodiments of the invention there may be provided a pressure sensing device that may include a first and second sensing elements that may include one or more piezoresistive materials; wherein the first sensing element has a first gradient; wherein the second sensing element has a second gradient; wherein the second gradient differs from the first gradient; wherein the first and second gradients facilitate a determination of a load of and a location of an event that involves applying pressure on the first and second sensing elements.

The one or more piezoresistive materials may be electrically conductive nanoparticles.

The one or more piezoresistive materials may be nanotubes.

The one or more piezoresistive materials may be nanowires.

The one or more piezoresistive materials may be carbon nanotubes.

The one or more piezoresistive materials may be carbon nanowires.

The pressure sensing device wherein at least one of the first and second gradients may be a thickness gradient.

The pressure sensing device wherein at least one of the first and second gradients may be a width gradient.

The pressure sensing device wherein at least one of the first and second gradients may be a concentration gradient.

The pressure sensing device wherein at least one of the first and second gradients may be a resistance gradient.

The pressure sensing device wherein at least one of the first and second gradients may be a sensitivity to strain gradient.

The pressure sensing device wherein at least one of the first and second gradients may be capping layer thickness gradient.

The pressure sensing device, further may include a sensing circuit that may be coupled to the first and second sensing elements, may be arranged to sense at least one out of resistance and conductance of at the first and second sensing elements and to determine at least one out of a location and a load of an event that involves applying pressure on the first and second sensing elements.

The first sensing element may include multiple first regions, wherein the multiple first regions differ from each other by location; wherein at an absence of the event there may be a one to one mapping between a given property of a first region and a location of the first region.

The second sensing element may include multiple second regions, wherein the multiple second regions differ from each other by location; wherein at an absence of the event there may be a one to one mapping between a give property of a second region and a location of the second region.

The one to one mapping between the given property of the first region and the location of the first region may be anti-symmetric to the one to one mapping between the given property of the second region and the location of the second region.

The first gradient may be anti-symmetric to the second gradient.

The sensing circuit may be arranged to determine the location at a spatial resolution that may be a fraction of length of first sensing element.

The sensing circuit may be arranged to determine the location at a spatial resolution that may be less than one percent of the length of the first sensing element.

According to various embodiments of the invention there may be provided a pressure sensing device that may include a sensing element array that may include multiple sensing elements that may include one or more piezoresistive materials; wherein the sensing element array may be characterized by a sensing array given property function that maps values of a given property of the multiple sensing elements to at least one out of location and a load of an event that involves applying pressure on at least one sensing elements of the sensing element array; wherein the location of the event may be selected out of a group of locations that may be associated with the sensing element array; and wherein each one of the multiple sensing elements may be associated with a plurality of location of the group of locations.

The given property may be resistance.

The given property may be sensitivity.

The one or more piezoresistive materials may be electrically conductive nanoparticles.

The one or more piezoresistive materials may be nanotubes.

The one or more piezoresistive materials may be nanowires.

The one or more piezoresistive materials may be carbon nanotubes.

The one or more piezoresistive materials may be carbon nanowires.

The pressure sensing device may include a sensing circuit that may be coupled to the sensing element array, may be arranged to sense resistances of at least some of the multiple sensing elements of the array and to determine the location and the load of the event.

The pressure sensing device 9 wherein at least two of the sensing elements of the sensing element array differ from each other by their sensing element given property function.

The at least two of the sensing elements of the sensing element have sensing element given property functions that may be anti-symmetrical to each other.

The pressure sensing device may have a pair of pressure sensing elements may be characterized by a given property function that may be injunctive and maps values of the given property of the sensing elements of the pair to at least one out of location and a load of a deformation event applied on at least one of the sensing elements of the pair.

The sensing elements of the pair have sensing element given property functions that may be anti-symmetrical to each other.

The array of sensing element may be a strip that may include two sensing elements that may be substantially parallel to each other.

The pressure sensing device wherein sensing element array may include first and second layers of sensing elements; wherein the first layer of sensing elements may be positioned above the second layer of sensing elements.

The first and second layers of sensing elements may be substantially parallel to each other.

The first and second layers of sensing elements may be substantially normal to each other.

The first and second layers of sensing elements may be oriented in relation to each other.

The pressure sensing device may include an intermediate isolating layer that may be positioned between the first and second layers.

The pressure sensing device may include at least one intermediate layer that may be positioned between the first and second layers.

The pressure sensing device may include at least one protective layer that may be coupled to an exterior facet of at least one of the first and second layers.

The pressure sensing device wherein each one of the multiple sensing elements may be associated with at least one hundred location of the group of locations.

The sensing circuit may be coupled to the sensing element array by a set of conductors, wherein a number of conductors may be in an order of a number of the multiple sensing elements.

The sensing element array may be flexible.

The pressure sensing device wherein a sensing element of the multiple sensing elements has a spatial character that monotonically changes along a longitudinal axis of the sensing element.

The spatial character may be a width of the sensing element.

The spatial character may be a height of the sensing element.

The pressure sensing device wherein a sensing element of the multiple sensing elements has an electrically conductive nanoparticles concentration character that changes along an axis of the sensing element.

The pressure sensing device wherein a sensing element of the multiple sensing elements has an electrically conductive nanoparticles concentration character that monotonically changes along a longitudinal axis of the sensing element.

The pressure sensing device wherein a sensing element of the multiple sensing elements has a resistance that monotonically changes along a longitudinal axis of the sensing element when the sensing element may be not under pressure.

The pressure sensing device wherein each sensing element may be a strip.

According to various embodiments of the invention there may be provided a pressure sensing device that may include multiple pairs of sensing elements that may be arranged in a serial manner to cover different regions of the sensing device; wherein each pair of sensing elements may include a first and second sensing elements that may include one or more piezoresistive materials; wherein the first sensing element has a first gradient; wherein the second sensing element has a second gradient; wherein the second gradient differs from the first gradient; wherein the first and second thickness gradients facilitate a determination of a load of and a location of an event that involves applying pressure on the first and second sensing elements.

The multiple pairs of sensing elements may be coupled to conductors that provide independent access to each one of the pairs of sensing elements.

The pressure sensing device wherein multiple pairs of sensing elements may be coupled to a flexible substrate and may be configured to sense bending points of the flexible substrate.

The different regions may be serially positioned regions.

The different regions may be non-overlapping.

The different regions partially overlap.

According to various embodiments of the invention there may be provided methods for operating any of the mentioned above pressure sensing devices and/or methods for manufacturing any of the mentioned above pressure sensing devices.

According to various embodiments of the invention there may be provided a method for sensing, the method may include providing a pressure sensing device that includes a first and second sensing elements that comprise one or more piezoresistive materials; wherein the first sensing element has a first gradient; wherein the second sensing element has a second gradient; wherein the second gradient differs from the first gradient; wherein the first and second gradients facilitate a determination of a load of and a location of an event that involves applying pressure on the first and second sensing elements; and sensing, by the pressure sensing device, the load and the location of the event.

According to various embodiments of the invention there may be provided a method for sensing, the method may include providing a pressure sensing device that includes a sensing element array that comprises multiple sensing elements that comprise one or more piezoresistive materials; wherein the sensing element array is characterized by a sensing array given property function that maps values of a given property of the multiple sensing elements to a location and/or a load of an event that involves applying pressure on at least one sensing elements of the sensing element array; wherein the location of the event is selected out of a group of locations that are associated with the sensing element array; wherein each one of the multiple sensing elements is associated with a plurality of location of the group of locations; and sensing, by the pressure sensing device, the load and the location of the event.

According to various embodiments of the invention there may be provided a method for sensing, the method may include providing a pressure sensing device that includes multiple pairs of sensing elements that are arranged in a serial manner to cover different regions of the sensing device; wherein each pair of sensing elements comprises a first and second sensing elements that comprise one or more piezoresistive materials; wherein the first sensing element has a first gradient; wherein the second sensing element has a second gradient; wherein the second gradient differs from the first gradient; wherein the first and second thickness gradients facilitate a determination of a load of and a location of an event that involves applying pressure on the first and second sensing elements; and sensing, by the pressure sensing device, the load and the location of the event.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1B illustrates a strip according to an embodiment of the invention;

DETAILED DESCRIPTION OF THE DRAWINGS

Figure 1A:
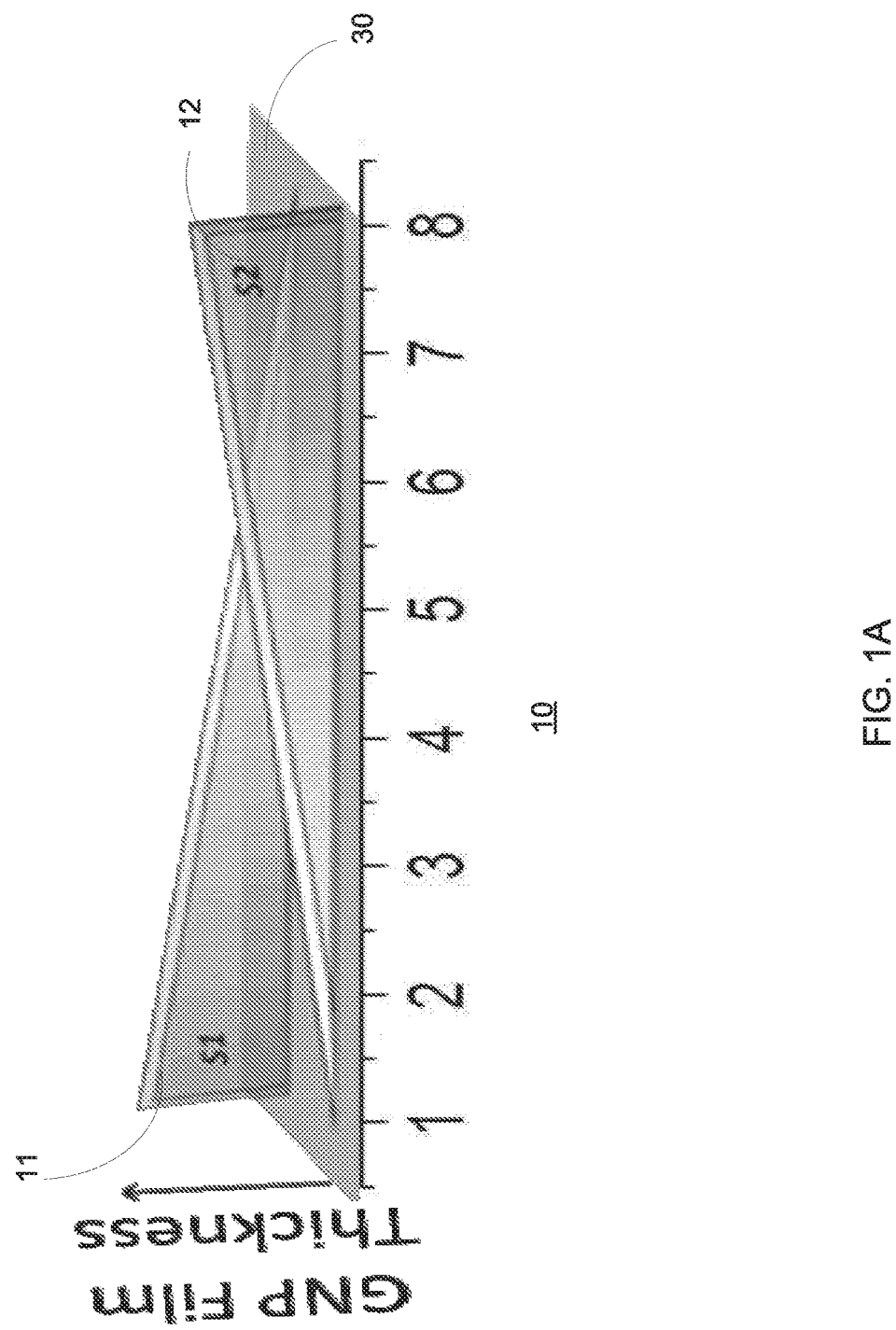
FIG. 1A illustrates a strip according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device capable of executing the method.

Any reference in the specification to a device should be applied mutatis mutandis to a method that may be executed by the device.

According to an embodiment of the invention there is provided a device that has sensing elements and has a spatial resolution that is much finer than the number of sensing elements. In other words, each sensing element may represent multiple possible locations—and may be equivalent to multiple pixels. This property of the device is terms "unpixelated"—as the device does not allocate an entire sensing element per single location—per pixel.

According to an embodiment of the invention there is provided a pressure sensing device that includes (a) a first sensing element that is made of or includes one or more piezoresistive materials and has a first gradient and (b) a second sensing element that is made of or includes one or more piezoresistive materials and has a second gradient that differs from the first gradient. A piezoresistive material may changes its resistivity as a response to pressure or strain e.g.

Non-limiting examples of a piezoresistive materials included in the first and/or second sensing elements include nanoparticles, carbon nanotubes and nanowires. In a different embodiment the first and/or second elements may include conductive or semi-conductive polymers.

For brevity of explanation the following explanation refers to nanoparticles. Any reference to a nanoparticle should be applied mutatis mutandis to a reference to a piezoresistive material such as but not limited to carbon nanotubes or nanowire.

Non-limiting example of a gradient may include a thickness gradient, a width gradient, a concentration gradient, a resistance gradient, a sensitivity to strain gradient, a capping layer thickness gradient, a cross section gradient, and the like.

For brevity of explanation the following explanation refers to a thickness gradient. Any reference to a thickness gradient should be applied mutatis mutandis to a reference to any other gradient such as but not limited to a width gradient, a concentration gradient, a resistance gradient, a sensitivity to strain gradient, a capping layer thickness gradient, a cross section gradient, and the like.

According to an embodiment of the invention there may be provided a nanoparticle pressure sensing device, that may include a first sensing element that comprises multiple electrically conductive nanoparticles; wherein the first sensing element has a first thickness gradient; a second sensing element that comprises multiple electrically conductive nanoparticles; wherein the second sensing element has a second thickness gradient that differs from the first thickness gradient. Wherein the first and second sensing elements have resistances that once read by a sensing circuit allows the sensing circuit to determine a location and/or a load of an event that involves applying pressure on the first and second sensing elements. The nanoparticle pressure sensing device may include the sensing circuit. Non-limiting examples of first and second sensing elements are gold nanoparticles.

According to an embodiment of the invention there may be provided a nanoparticle pressure sensing device that may include a sensing element array that comprises multiple sensing elements; wherein each sensing element comprises multiple electrically conductive nanoparticles; wherein the sensing element array is characterized by a sensing array resistance function that maps resistances of the multiple sensing elements to a location and/or a load of an event that involves applying pressure on at least one sensing elements of the sensing element array. The sensing element array may be one dimensional, two dimensional, may be flexible, shaped as a strip and the like. The sensing element array may include one or more layers of sensing elements. The sensing element array may be a sensing circuit that is coupled to the sensing element array, is arranged to sense resistances of at least some of the multiple sensing elements of the array and to determine the location and the load of the event. The location of the event is selected out of a group of locations that are associated with the sensing element array. Each one of the multiple sensing elements is associated with a plurality of location of the group of locations.

According to an embodiment of the invention there is provided a flexible substrate with two parallel gold nanoparticle (GNP) strips with anti-parallel sensitivity gradients for an un-pixelated skin strip that diminishes the readout data for two resistance measurements only, acquired through three terminals. The smart patch exhibits highly sensitive prediction of both the load applied and position along the sensing strip and is sensitive to various environmental stimuli, such as temperature, humidity and volatile organic compounds.

The following text assumes that the sensing device include one or multiple pairs of sensing elements such as GNP sensing strips GSS that are parallel to each other with opposite thickness gradients. This is merely a non-limiting example.

According to an embodiment of the invention there is provided a flexible polymer foil with two GNP sensing strips (2-GSS) parallel to each other with opposite thickness gradients.

A thickness of the sensing element may be measured along any imaginary axes that is oriented (for example—normal) to a longitudinal axes of the sensing element. The thickness may, for example, represent the height of the sensing element, the width of the sensing element of a combination of both. Changes in the thickness of the sensing element along its longitudinal axis may represent changes in the cross section of the sensing element.

FIG. 1A illustrates a strip 10 that includes two GSSs 11 and 12 that are spaced apart from each other and mounted on a flexible substrate 30 according to an embodiment of the invention. Both GSSs have a triangular shape with opposite slopes—wherein in one GSS the rightmost edge is of a maximal height and in another GSS the leftmost edge of maximal height. It is noted that the cross section of the GSS may change at another manner (for example the width of the GSS can change in an anti-symmetric manner—as illustrated in FIG. 1B, and/or a combination of both height and width may change). FIG. 1B also shows conductors 50 and sensing circuit 70. Sensing circuit 70 measures the resistance of the first and second GSSs 11 and 12. It is noted that the number of conductors 50 may equal four or may differ from four. For example one conductor may be connected in parallel to one end of each one of GSSs 11 and 12. It is noted that sensing the resistance is equivalent to sensing the conductivity of the GSSs or any sensing of any electrical and/or magnetic parameter of the sensing element that is indicative of the occurrence of the event.

Figure 2:
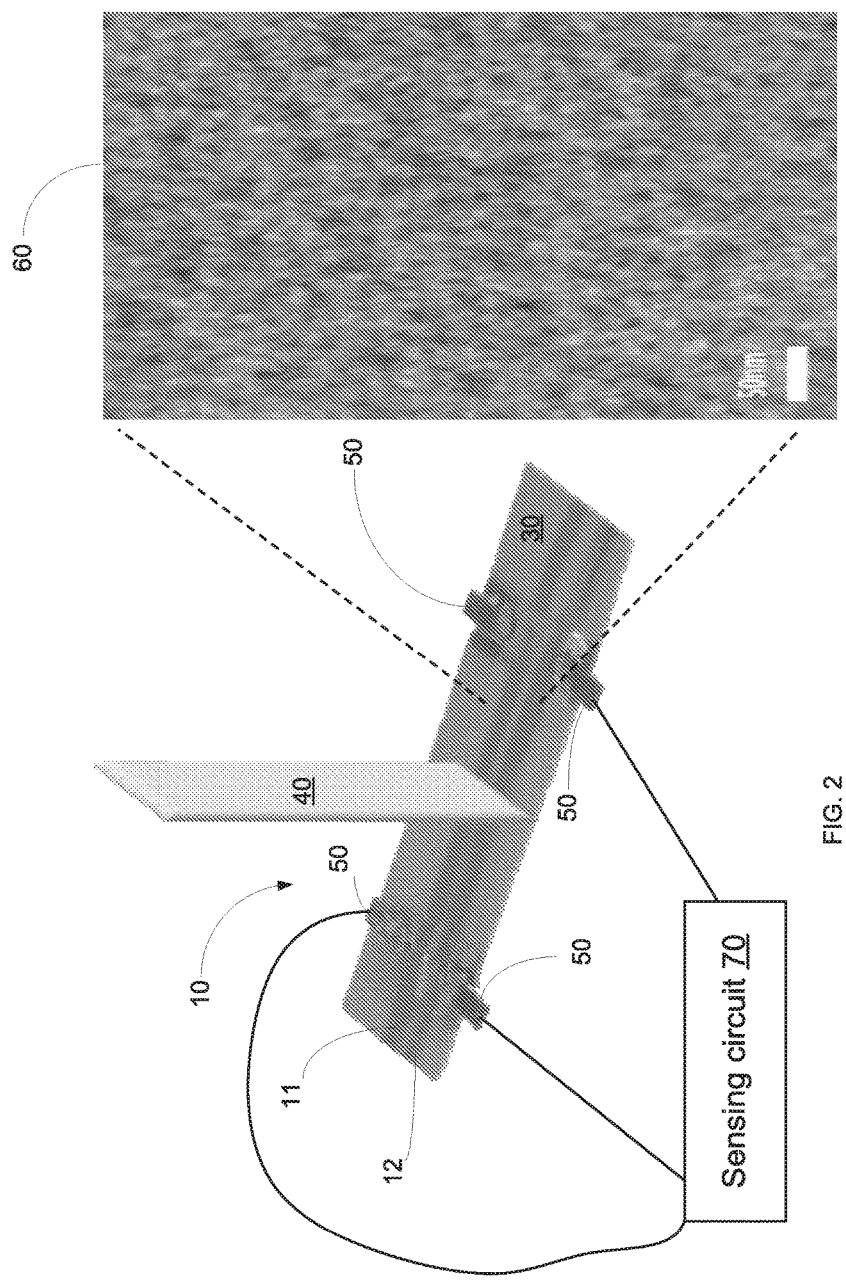
FIG. 2 illustrates a strip and a testing element that scans strip and applies pressure at different positions during a calibration stage according to an embodiment of the invention.

FIG. 2 illustrates a strip 10 that includes two GSSs 11 and 12, conductors 50 and a testing element 40 that scans the two GSS and applies pressure at different positions during a calibration stage according to an embodiment of the invention. The GSS extend over a distance of 8 mm and are spaced apart from each other by 0.5 mm. FIG. 2 also illustrates a scanning electron microscope image 60 of one of the GSSs with a scale bar of 50 nanometer.

Due to the gradual changes in the thickness, the electrical property (resistance or conductivity) of GSSs 11 and 12 changes along the longitudinal dimension in the opposite direction of the neighboring strip. Consequently, measuring the resistances of the adjacent strips subjected to load at a specific location enables accurate calculation of both the applied load and its location along the sensing strip 10.

It is noted that the strip may include or be coupled to a sensing circuit such as sensing circuit 70 of FIG. 1B. The sensing circuit 70 may be configured to measure the resistance by any known method. The sensing circuit 70 may be located in proximity to the GSSs, or located in a greater distance. It may be a part of a flexible patch or coupled to the patch.

The GSSs may be produced by any applicable method. For example they may be manufactured by a "propelled anti-pinning ink droplet (PAPID)" manufacturing process which is suitable for fabrication of centimeters long GNP lines.

Using the PAPID approach, two 8 mm long GNP sensing strips (2-GSS) with counter-directional thickness gradients and resistance of ~50 MΩ were fabricated over a strip of polyimide foil. The cross-sectional thickness gradients and related morphology were studied and verified using High Resolution Scanning Electron Microscopy.

Generally speaking, the average thickness of the "thick" edge segment of the strip, middle segment, and the "thin" edge segment of the GSS is about 4 microns, 1.5 microns and 0.5 microns respectively. Different average thicknesses along the sensing strip of the "thick", middle and "thin" segments can also be smaller, such as 300 nm, 200 nm and 100 nm.

The GSSs provide a continuous (or defect-free) coverage of the GNPs over the GSS strip. The GSS may operate in room temperature which is advantageous for flexible and printed electronics. The GSSs, conductors and the substrate may be manufactured using a simple fabrication process in which both the conductive electrodes and the sensing strip are fabricated using the same GNP solution and a similar fabrication process.

The inventors measured the resistances of the 2-GSS (about 10 times per second) while constant speed deformation was applied at different locations. The predicted load was calculated based on the predefined calibration equations set.

The correlation coefficient between the predicted and the actual load was calculated for eight (spaced at 1 mm) locations along the 2-GSS. The results disclosed high correlations (above 0.99) for all locations, as presented in graphs 100 of FIG. 3.

Figure 3:
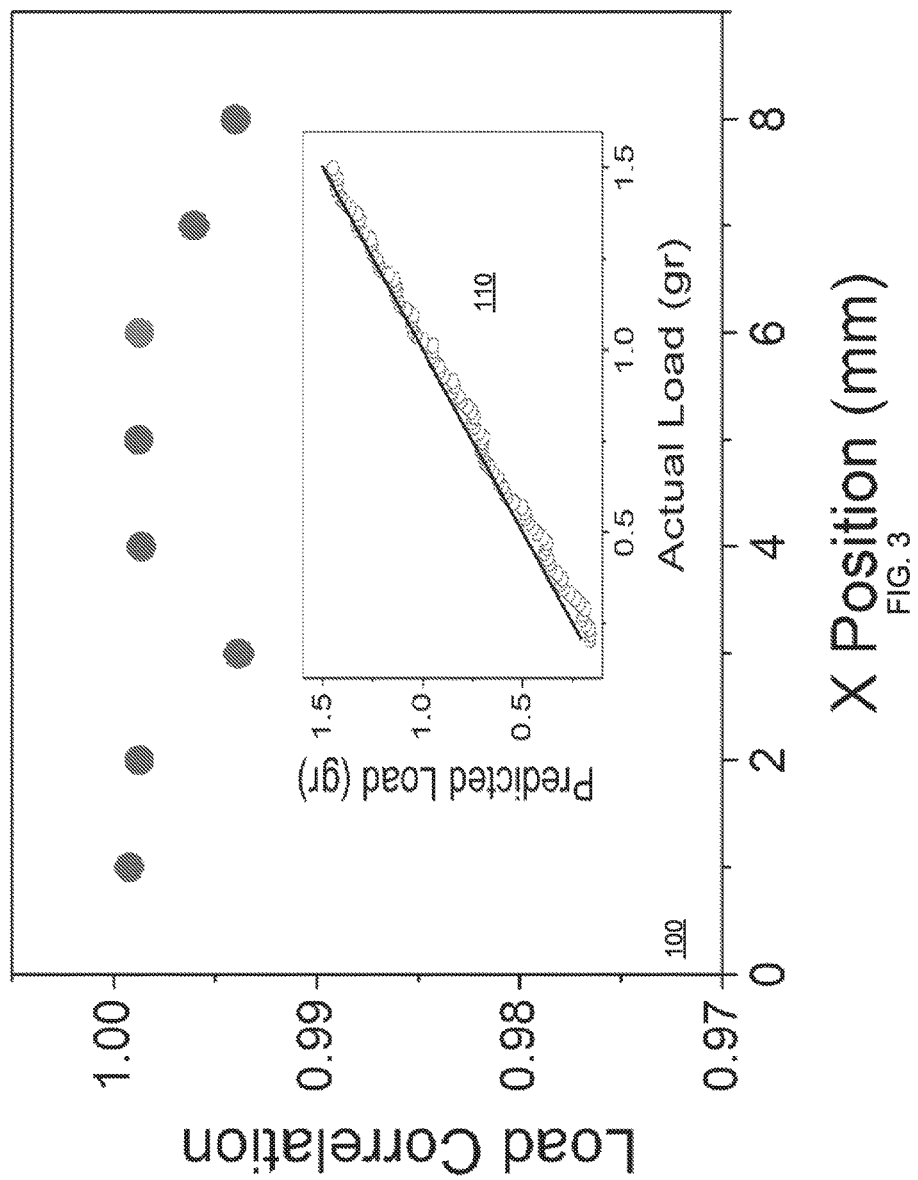
FIG. 3 illustrates a correlation coefficient between the predicted and the actual load according to an embodiment of the invention.

The inset 110 of FIG. 3 represents a typical graph of the predicted load vs. the actual load. In this setup, load variations as small as 0.014 gr were detectable. This load is comparable to the smallest detectable loads reported when using a single pixel.

The same set of equations was used to predict the location on which the load/strain was applied, based on the predicted loads. The predicted vs. the actual position are presented by graph 120 of FIG. 4. The circles stand for the calculated results and the black line stand for perfect correlation.

Figure 4:
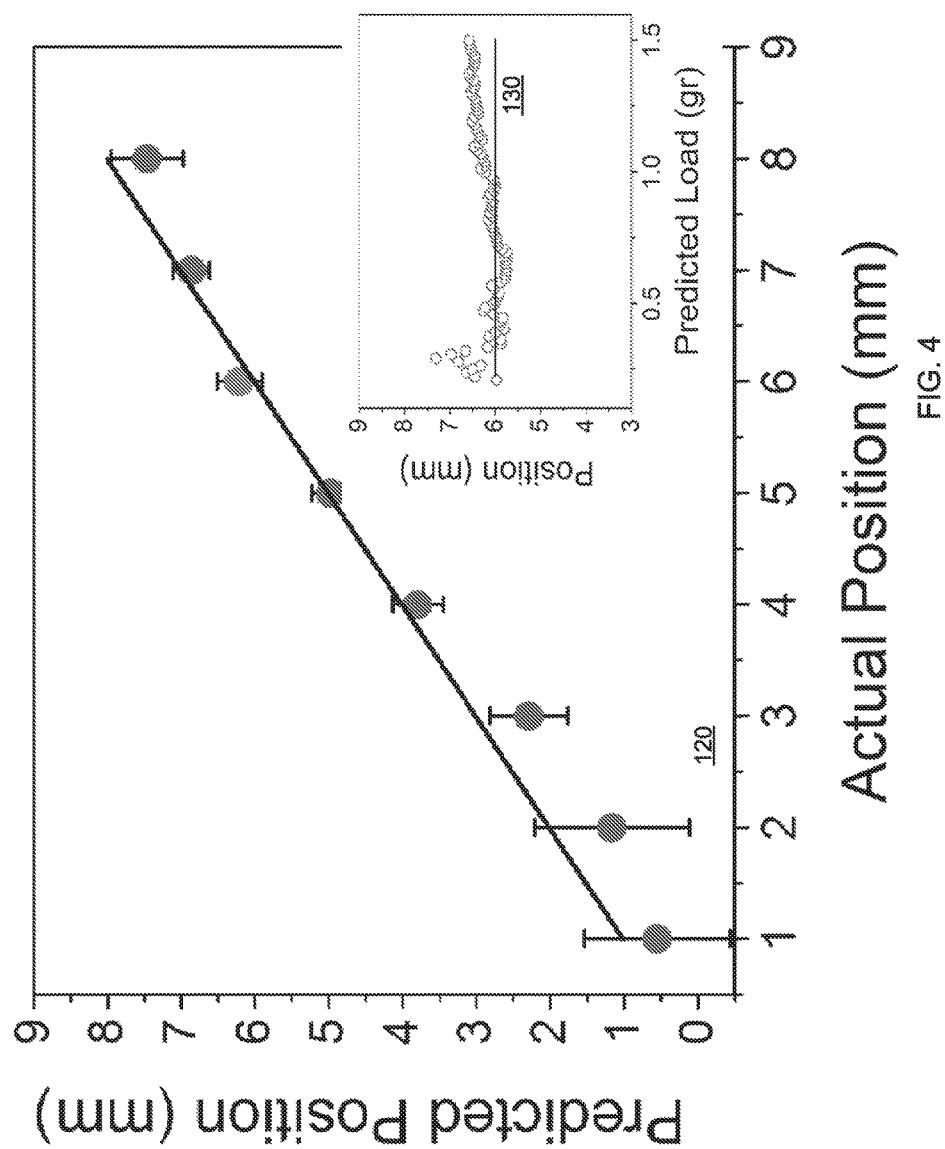
FIG. 4 illustrates the predicted and the actual position according to an embodiment of the invention.

The inset 130 of FIG. 4 is an example of the predicted position for all loads. The calculated position resolution for the 2-GSS (along the thickness gradient direction) is <1 mm, which is one of the highest location resolution yet reported for a pressure sensitive array of sensors.

For the presented un-pixelated smart patch, the final dimension of the device are not affected by dense wiring as might be the case for pixelated technologies and might set back large scale applications.

Figure 5:
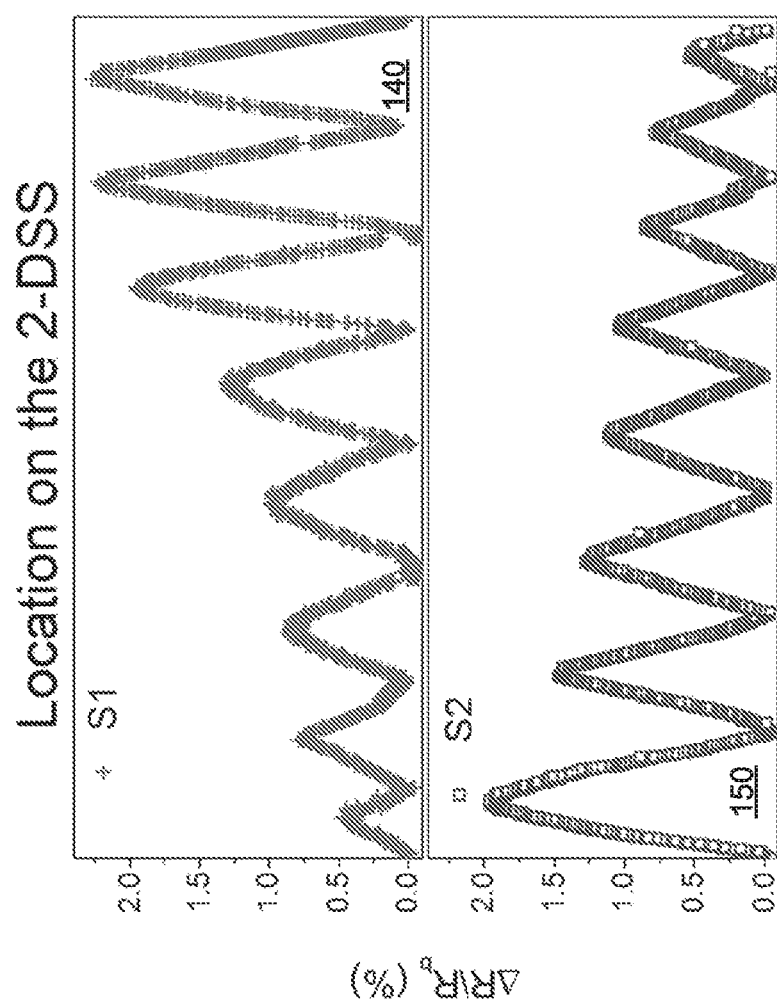
FIG. 5 illustrates a response of the strip to continuous deformation events of loads in the range 0.02-1.5 gr at different location, according to an embodiment of the invention.

The GSS can be compared to a series of electrical resistors where the overall resistance equals the sum of resistances of the local resistors. Therefore, a deformation event at a given location causes a resistance change that has different characteristics than a deformation event with the same strain but at a different location. The response of the GSS device over time to continuous deformation events of loads in the range 0.02-1.5 gr at different location are presented in graphs 140 and 150 of FIG. 5—the upper graph 140 refers to a first GSS 10 and the lower graph 150 refers to second GSS 12.

For example, when deforming a high resistance (low thickness) segment of the GSS device, like location 1 in graph 150, the change in the overall resistance is dramatic and high response to the deformation is recorded. Combining two GSSs with opposite gradients gives a one dimensional sensor that can act as an smart patch and sense pressure/strain and location based on two predefined calibration equations and only two resistance measurements as the readout data.

The responses of a single GSS to load at specific locations on the linear sensor were calculated as the difference between the electrical resistance of the deflected sensor, R, and the electrical resistance with no deflection applied, $R_b$, relative to $R_b$.

The 2-GSS strip was assembled on four PDMS supports. Load was applied on the strip by a 100 µm thick polyester sheet pressing the strip at a constant speed (1.5 mm/sec). The range of applied load in this setup was 0.02-1.5 gr. At each location (1-8) the load was increased and then decreased while the resistance of the GSS was recorded.

Figure 6:
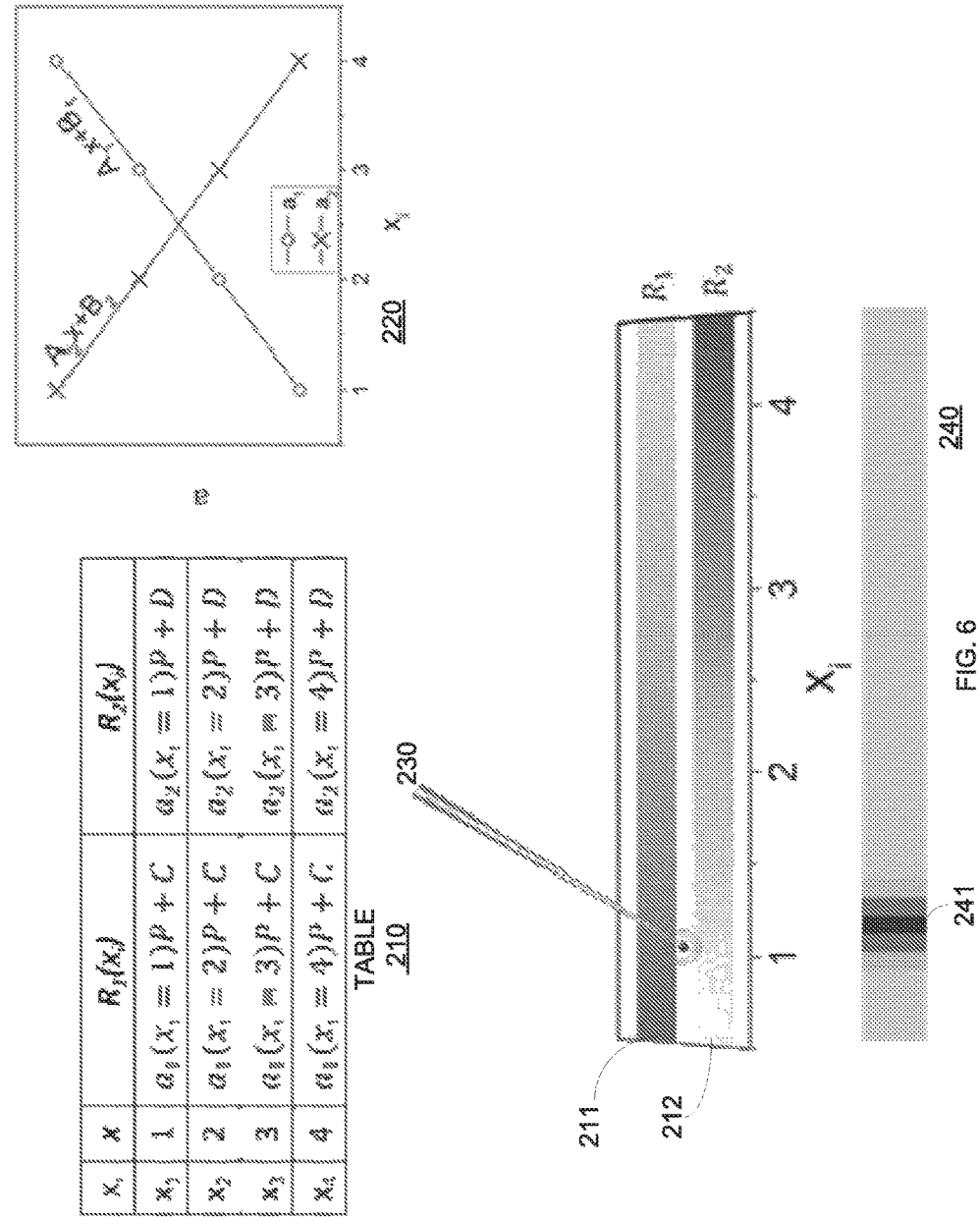
FIG. 6 illustrates a mathematical model for predicting the location and the load in the strip of FIG. 1A according to an embodiment of the invention.

FIG. 6 illustrates a mathematical model for predicting the location and the load in the strip 10 and 11 of FIG. 1A.

The model for predicting the load and location of a deformation event on a 2-GSS device is based on two sets of calibration experiments, one for each GSS.

In the calibration process, the 2-GSS device is subjected to a continuous deflection at different specified locations ($x_i$) along the device while measuring the resulting change in load and resistance of each GSS at each location.

From these load and resistance measurements linear fits are adjusted for each GSS at each specific location $x_i$ giving a set of linear fits for each GSS, as summarized in the table 210—see third and fourth columns.

For example, when applying continuous deflection at a specific location, $x_1$, the change in the resistance of $GSS_1$, $R_1$, will be linear. The sensitivity to load at the specific location is the slope, $a_1$, which defines the change in resistance as a function of load.

The intercept, C, will be the resistance of the GSS when no load is applied.

Linear fits between the load sensitivity of first and second GSS 11 and 12 respectively, and the location, $x_i$, will give a set of two new equation: $R_1=(A_1x+B_1)P+C$ $R_2=(A_2x+B_2)P+D$ Adding to these two equations the resistances of the GSSs when no load is applied (C and D) gives a set of two calibration equations which defines the correlation between the measured resistance of each GSS, $R_1$ and $R_2$, and both the load applied on the GSS and its location—as illustrated in graph 220.

FIG. 6 also illustrates an appliance of load 230 at a specific location along strip 10, according to an embodiment of the invention. Each of the first and second GSS 11 and 12 is illustrated by a line with varying gray-levels 211 and 212. The varying gray-levels represent the variable height (or width) of each one of GSS 11 and 12 or the local sheet resistance. The two calibration equation set will enable the user to calculate the location of the applied load and the load by simply measuring the resistances of the two GSSs. The estimated location 241 of the appliance of the pressure (230) is illustrated by black line 241 of strip 240.

Figure 7:
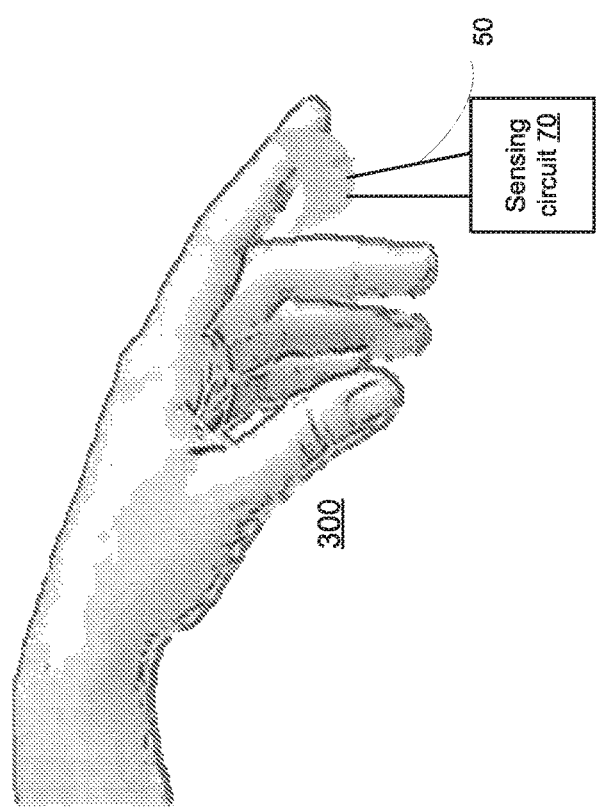
FIG. 7 illustrates a patch that includes a strip and a finger according to an embodiment of the invention.

FIG. 7 illustrates strip 10 that contacts a finger of a hand 30 of a person according to an embodiment of the invention. Strip 70 is coupled to sensing circuit 70 via conductors. Sensing circuit 70 may simultaneously (or in a serial manner) measure the resistance of both sensing GSSs 11 and 12 and apply a mathematical triangulation algorithm based on two equations with two variables (load and position), from which both the load applied on the 2-GSS and its position along the strips can be predicted in an analog manner.

According to an embodiment of the invention the GSSs and/or the strip itself may be protected by a protective layer that may be connected to the GSSs and/or the strip. The protective layer may be thin enough such as not to isolate the GSSs and/or the strip from pressure and may be flexible. The protective layer may be connected to the GSSs and/or strip at an external facet (directed to the location from which pressure is expected to be applied) and/or to an internal facet.

Figure 8:
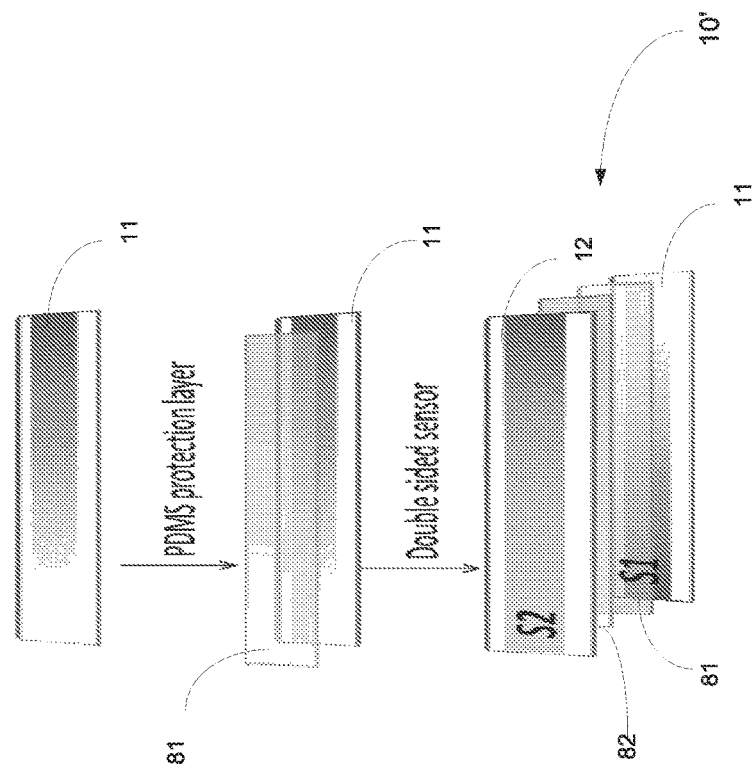
FIG. 8 illustrates a strip that include a dual layer array according to an embodiment of the invention.
Figure 9:
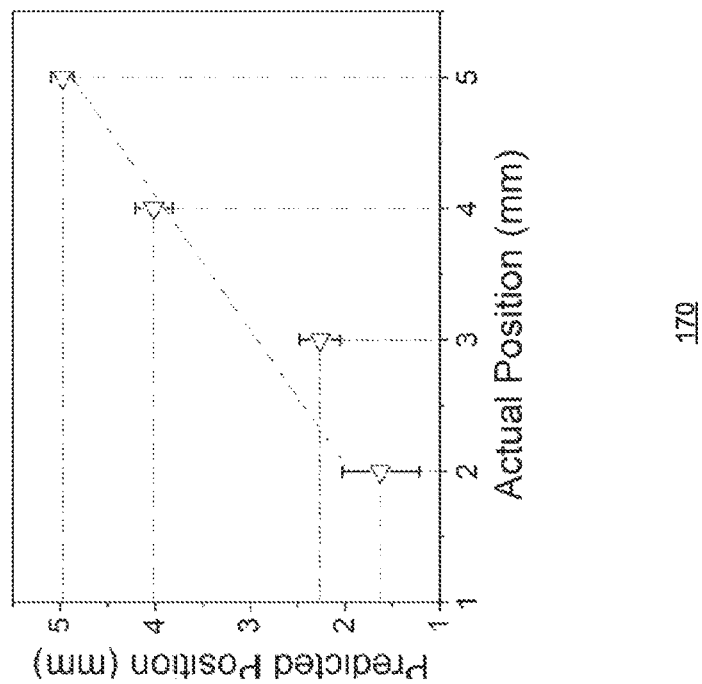
FIG. 9 illustrates resulting prediction of loads and positions of the strip of FIG. 8 according to an embodiment of the invention.
Figure 9:
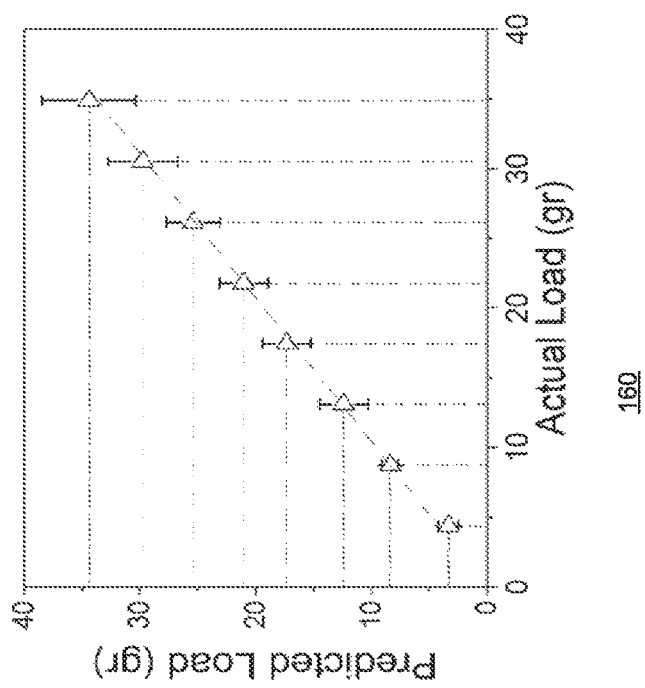
Figure 10:
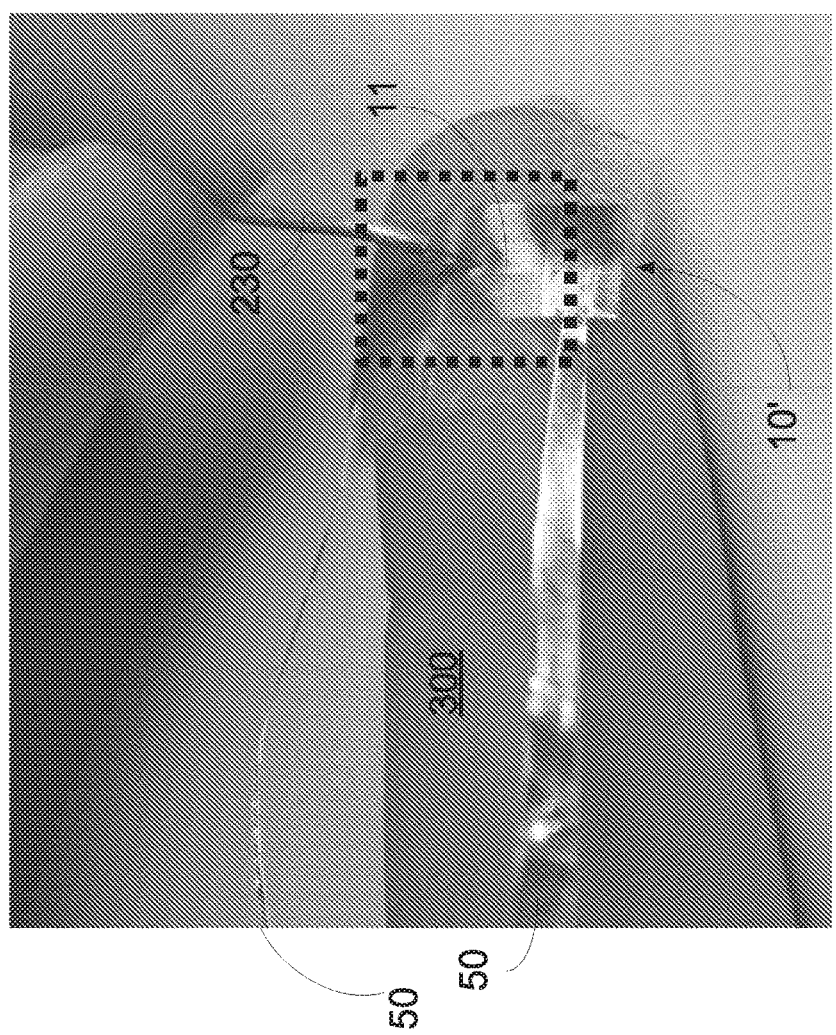
FIG. 10 illustrates a finger that contacts the strip of FIG. 8 and a pressure that is applied at a certain location according to an embodiment of the invention.

FIG. 8 illustrates a dual layer array 10' in which a pair of GSSs 11 and 12 were placed one above the other with one or more PDMS layers 81 and 82 protecting them from physical damage, and positioned between the GSSs according to an embodiment of the invention. It is noted that an intermediate layer may be provided between the first and second GSSs which electrically isolating the layers from each other. Graphs 160 and 170 of FIG. 9 illustrates the resulting prediction of loads and positions according to an embodiment of the invention. Position resolution remains 1 mm, yet the loads applied in this setup are higher (load range: 4.5 gr-35 gr) since the device's substrate is thicker. This load range is suitable for sensing 1 μm diameter tip on a finger, as presented in FIG. 10. FIG. 10 illustrates a finger 300 that contacts strip 10', and a pressure that is applied at a certain location 230 according to an embodiment of the invention. GSSs 11 and 12 are coupled via conductors 50 to a sensing circuit (not shown). In addition, the PDMS protective layers provide improved adhesion between device and skin. Unpixelated smart patch can be implanted in a range of application like surgical robotics and wearable sensor in which many pixels, large amount of readout data and abundance of wiring might hinder technological progress. Thus, the technology presented is applicable as 3-terminal, one-dimensional electronic skin for accurate location and load/strain sensing.

Figure 11:
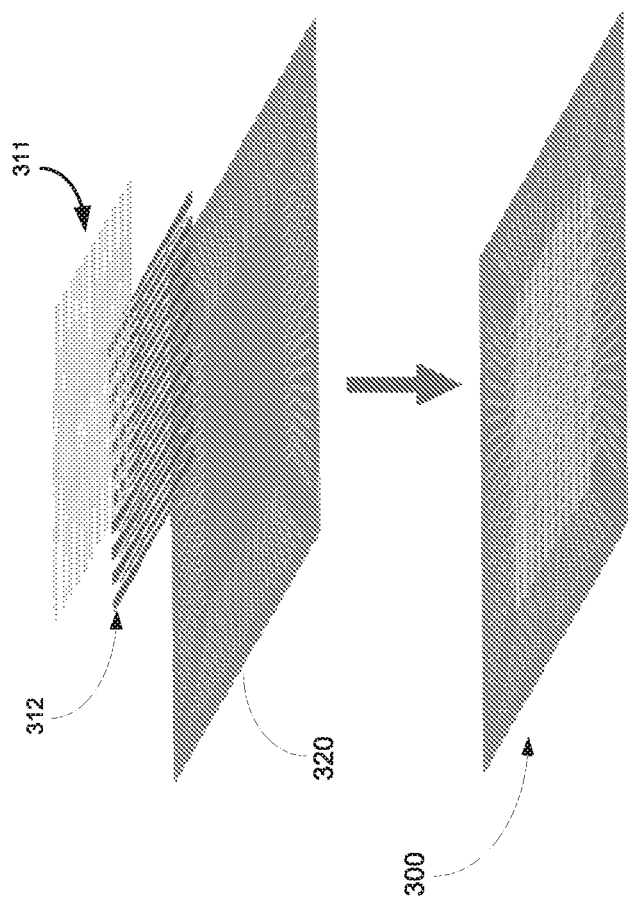
FIG. 11 illustrates a rectangular double-layered sensing element array according to an embodiment of the invention.

FIG. 11 illustrates a two dimensional sensing device 300 that include a first layer 311 of sensing element, a second layer 312 of sensing elements and a combination of conductors and substrate 320 according to an embodiment of the invention. The sensing elements of each layer may be parallel to each other and oriented (for example—by ninety degrees) in relation to the sensing elements of the other layer. The sensing elements of the layers may be, for example, GSS 11 and/or 12. The sensing elements of the same layer may have a symmetrical or asymmetrical resistance gradient, they may have the same resistance gradient, or may differ from each other. Alternatively, some sensing elements of the same layer may have the same resistance gradient while some other sensing elements of the same layer may have different resistance gradient.

Figure 12:
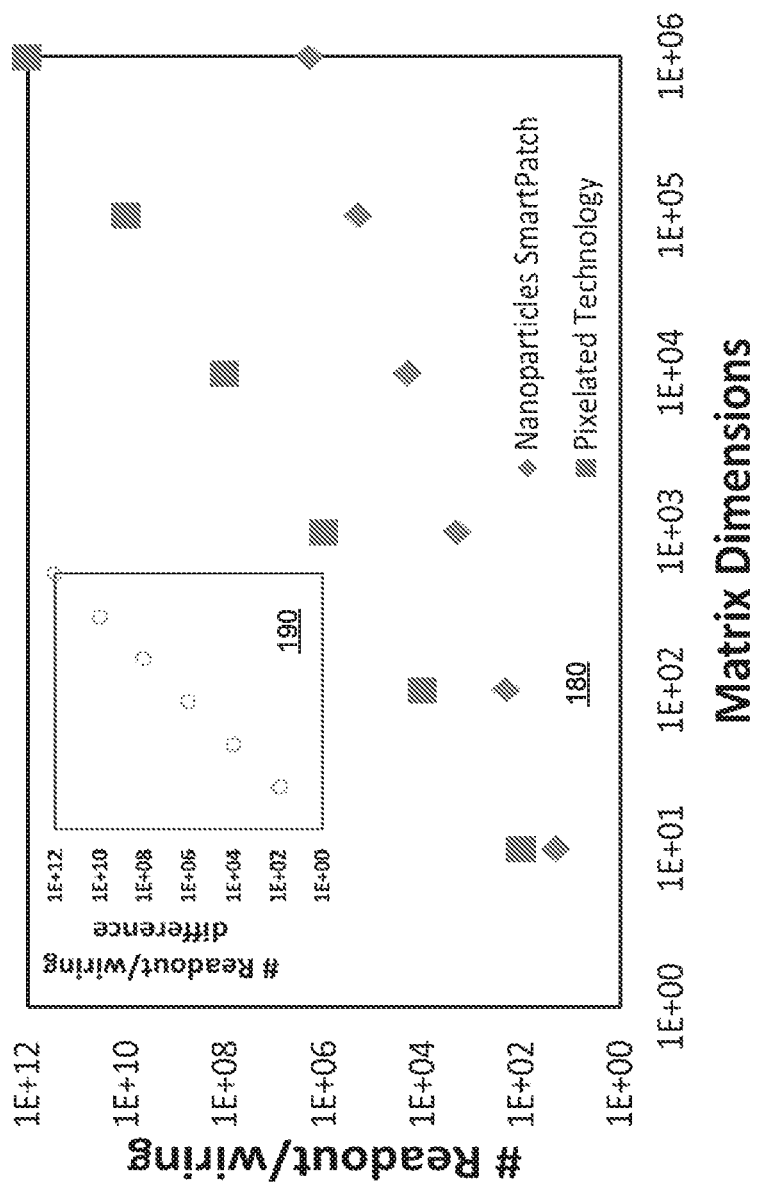
FIG. 12 illustrates a relationship between dimensions and number or complexity of wiring and/or of readout circuits according to an embodiment of the invention.
Figure 13:
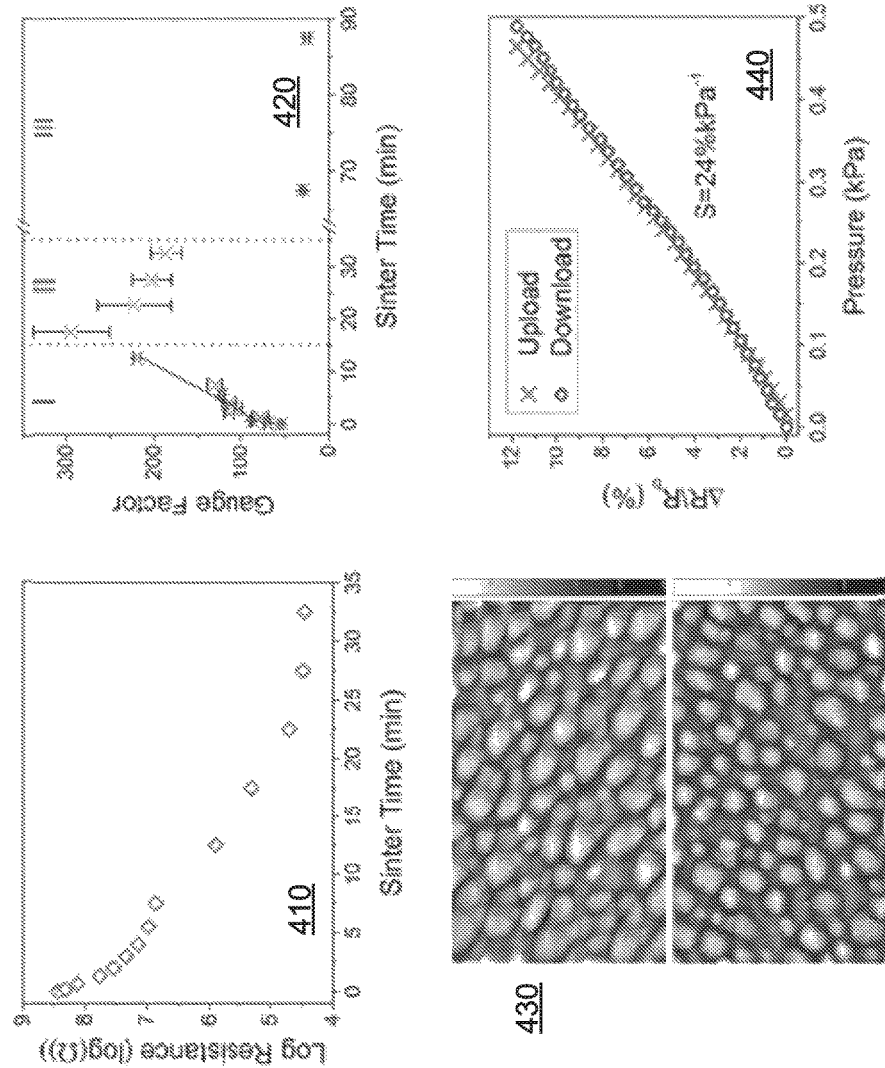
FIG. 13 illustrate experimental results according to an embodiment of the invention.

Graph 180 of FIG. 12 illustrates the relationship between a two dimensional array of pixels or sensing strips (referred to as matrix dimension) and the number or complexity of wiring and/or of readout circuits. Insert 190 represents the difference in readout or required wiring between a pixelated array of pressure sensors and the equivalent smart patch without difference.

Experimental Results

Sintering and the consequent enlargement of GNPs affect the sensing properties of the GSS device. The resistance of GNP film decreases with increasing sintering time (graph 410), which corresponds to effective enlargement of GNPs. For example, the initial GSS resistance was $2.7 \cdot 10^8 \Omega$, Subsequently decreasing to $9.5 \cdot 10^6 \Omega$ after 5 min sintering at 150° C., and finally reaching a value of $5 \cdot 10^4 \Omega$ after a total of 22.5 min sintering. This decrease in resistance is required to produce centimeter scale GSSs with applicable device resistance ($\sim 5.10^8 \Omega$).

For smart patch applications, high durability and sensitivity towards strain (or pressure) are key factors. Fatigue test of GNP devices were carried out in our previous reports. Reproducible and reliable responses were recorded up to 10,000 banding cycles. The sensitivity of GNP-based sensors to strain stems mainly from the tunneling mechanism between neighboring nanoparticles. The mean Gauge Factor (GF) and the standard deviation are shown in graph 420.

The results can be divided into three sections. In section I, during the first 15 min of sintering (at 150° C.), there is a gradual linear increase in the GF from an initial value of 50 up to 220 after 13 min sintering. Indeed, the GF is expected to increase linearly with increasing GNP size. In section II, a sudden jump to a higher GF value (~300) is observed after 18 min sintering accompanied by a dramatic (order of magnitude) increase in the standard deviation. The varying high GF measurements in section II continue as long as the sintering steps are small (5 min). This phenomenon can be attributed to the formation of cracks during the bending step rather than to the tunneling mechanism. Finally, in section III, at long sintering times (>35 min), the GF declines to relatively low values of ~25. The low GF values are related to metallic-like behavior.

For conformation of cracks formation during bending in the second section, flat and curved (Radius of curvature ~10 mm) GSS device after a 20 min sintering step at 150° C. was scanned at similar locations using an AFM (images 430). In both cases, aggregates with diameter range of 100-500 nm are visible. Yet, for the image of the curved device, the spacing between those aggregates are larger, supporting the mechanism of cracks opening as the governing strain sensing mechanism. The study of mechanism controlling pressure/strain sensing enables the fabrication of un-pixelated smart patches with high sensitivity due to tunneling mechanism and avoiding unstable cracks formation.

Graph 440 presents high sensitivity to small pressures (0.0015-0.5 kPa), 24% $kPa^{-1}$, and high detection limit of 15 Pa. In addition the responses to load are highly linear and the behavior to increasing and decreasing the load is similar. Higher sensitivities were reported in recent years with OFET as the active component. Yet, the reported OFET requires high operating voltages (>20V), while the device presented here can operate in voltages as low as 0.5V, which makes it suitable for mobile and portable applications. Another prominent advantage of the un-pixelated approach is that only two resistance measurements and three terminals are required for an accurate readout of load and location, while in all other smart patch approaches, wiring and simultaneous measurements of many pixels hinder future applications of this technology.

The GNP sintering process was found to be very useful for controlling other inherent sensing capabilities of GNP devices like sensing temperature, relative humidity (RH) and volatile organic compounds (VOCs). Partial sintering of the GSS device raises a new opportunity of controlling and tuning the sensing abilities. For example, Controlling sensitivity to temperature is a major advantage for strain/pressure sensors as it allows reducing temperature related interferences with the sensing signal.

In conclusion, the front line of today's touch and position sensing technology relies on a pixelated array of touch sensors which requires a dense wiring network in between the sensing "pixels". To overcome this limitation, there is provided a flexible linear strain sensor which senses, in real-time, the position and strain (or load) of a deformation event along the sensor. The flexible polymer substrate may be deposited with 2-GSS that functions as resistive strain sensitive layers. The resistance of each GSS measured, using two electrodes printed over the polymer foil, changes in proportion to the deformation of the polymer foil. Since the NPs film of each of the 2-GSSs is intentionally deposited with a thickness gradient along the line (counter-directional between the two sensing strips), the resistance change of each line is also proportional to the location of the deformation event along the line. In this simple design, the sensor predicts both the load applied to the 2-GSS and the position of the deformation event along the device, using two load and position calibration equations and two resistance readouts. In addition, the polymer foil with the sensing films can be adhered to a stretchable substrate, such as PDMS, to support the foil and give it skin-like properties. Future prospects of the technology described include printing an array of GSSs for large area sensing. Greater control over the gradient properties of the GSS due to new printing and patterning technologies should further increase the load and location sensitivity and provide an easy-to-make, straightforward technology for smart patch application. Layers with different orientation of such an array in 2D manner might enable sensing of textured surfaces or multiple strained locations.

Device Fabrication.

Kapton substrates were received from DuPont.

Preliminary to electrodes fabrication, substrates were rinsed with Ethanol, Acetone and Isopropyl Alcohol following a UVO cleaning process at 150° C. for 5 min. Gold electrodes were fabricated by the propelled anti-ink droplet (PAPID) deposition approach using an ink of Hexanethiol (HT) encapsulated GNPs (the synthesis procedure of GNPs is detailed in the SI, Section6) accompanied by sintering for 1 hr at 300° C. Briefly, HT encapsulated GNPs were suspended in 7:3 Toluene:Nonane solution achieving a concentration of 42 mg (GNPs)/ml (solution). The combination of these two different solvents enabled to actuate a sessile droplet of the ink by tilting the substrate in a controlled manner, to create a GNP trail. The GNP trail was then sintered producing ultrathin conductive electrodes with a resistance on the order of tens of ohms. Electrodes for point devices were fabricated with 1 mm spacing whereas for GSS devices 8 mm spacing was employed. The GNPs films of the GSSs were fabricated in a similar way using a sessile droplet of the same HT encapsulated GNPs ink which was actuated perpendicularly on top of the gold electrodes. Sintering of the GSSs was done at 150° C. for various time periods.

Figure 14:
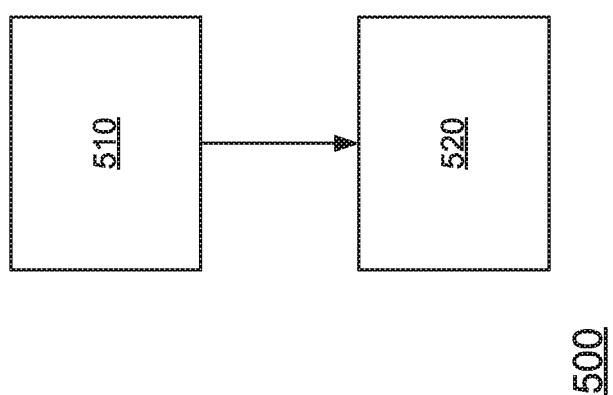
FIG. 14 illustrates a method according to an embodiment of the invention.

FIG. 14 illustrates method 500 according to an embodiment of the invention.

Method 500 may start by stage 510 of sensing the resistances of first and second sensing elements. The first sensing element may include multiple electrically conductive nanoparticles and has a first thickness gradient. The second sensing element may include multiple electrically conductive nanoparticles. The second sensing element has a second thickness gradient that differs from the first thickness gradient.

Stage 520 may follow stage 510 and may include determining a location and/or a load of an event that involves applying pressure on the first and second sensing elements. Method 500 may be applied mutatis mutandis on any of pressure sensing devices mentioned in the specification.

Figure 15:
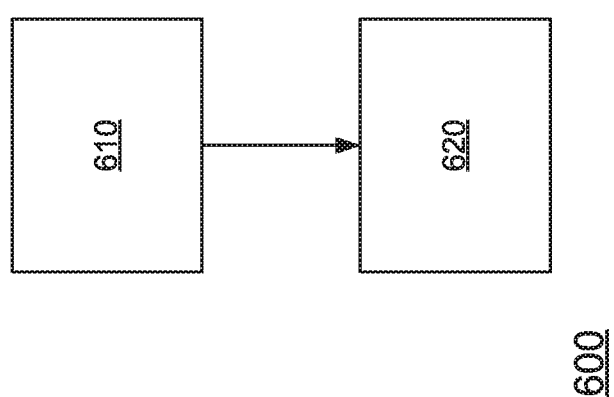
FIG. 15 illustrates a method according to an embodiment of the invention.

FIG. 15 illustrates method 600 according to an embodiment of the invention.

Method 600 may start by stage 610 of sensing the resistances of at least some of multiple sensing elements of a sensing element array. The sensing element array may include multiple sensing elements. Each sensing element may include multiple electrically conductive nanoparticles. The sensing element array may be characterized by a sensing array resistance function that maps resistances of the multiple sensing elements to a location and/or a load of an event that involves applying pressure on at least one sensing elements of the sensing element array.

Stage 620 may follow stage 610 and may include determining a location and/or a load of the event. The location of the event is selected out of a group of locations that are associated with the sensing element array. Each one of the multiple sensing elements is associated with a plurality of location of the group of locations. Stage 610 may include determining and/or outputting only one of the load and the location of the event.

The pressure sensing device may be fully printed using conventional printing methods (e.g., inkjet printing, pad printing) by which both the conductive layer and the sensing layer are printed on a flexible substrate.

Method 600 may be applied mutatis mutandis on any of pressure sensing devices mentioned in the specification.

Figure 16:
FIG. 16 is an image of a setup in which the contacts were printed using commercial silver ink and the sensing layer was printed using a custom made gold nanoparticles ink according to an embodiment of the invention.

FIG. 16 is an image of a setup 760 in which the contacts were printed using commercial silver ink and the sensing layer was printed using a custom made gold nanoparticles ink (with hexanethiol as the capping layer of the NPs) according to an embodiment of the invention.

Figure 17:
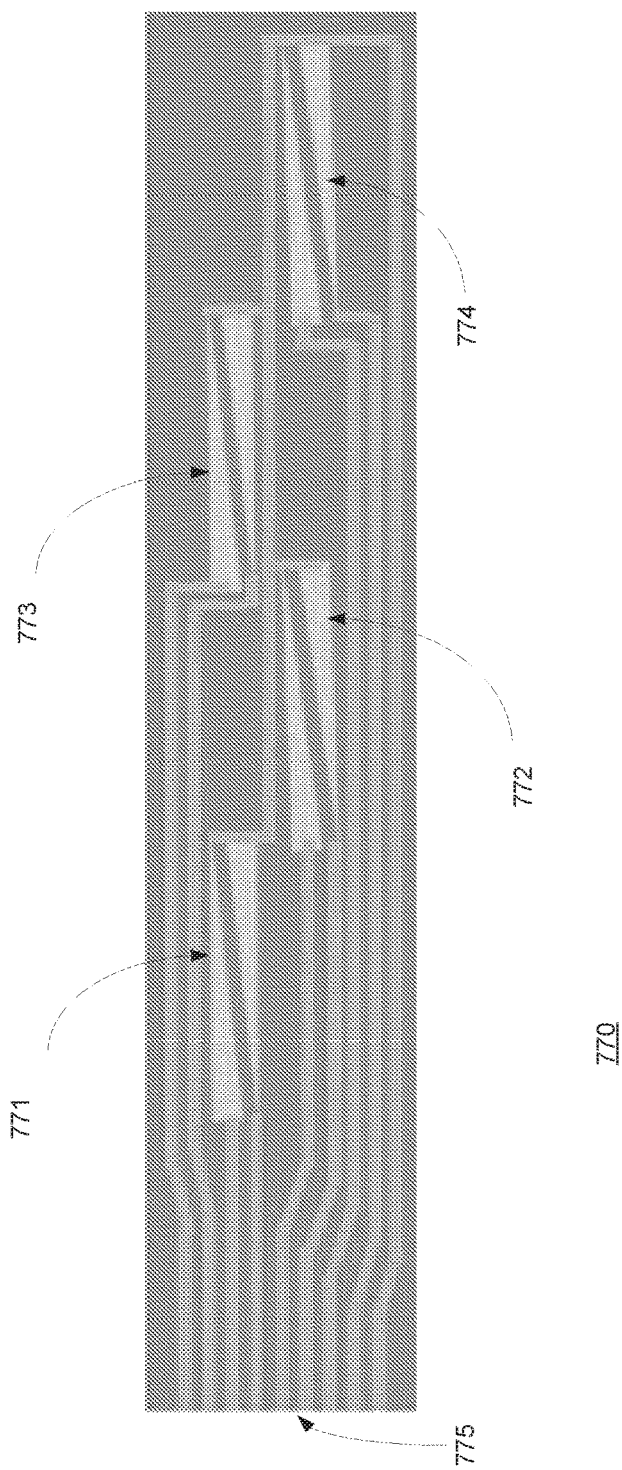
FIG. 17 illustrates a multi-bending monitoring strip (MBMS) according to an embodiment of the invention.

FIG. 17 illustrates a multi-bending monitoring strip (MBMS) 770 according to an embodiment of the invention.

FIG. 17 illustrates four pairs of anti-parallel sensing strips 771, 772, 773 and 774 that are arranged in a serial manner—each pair of anti-parallel sensing strips "covers" a different segment of the MBMS along a longitudinal axis of the MBMS. Each pair of anti-parallel sensing strips is configured to provide its readings independently (via conductors 775) of other pairs of anti-parallel sensing strips.

There may be a slight overlap between the pairs of anti-parallel sensing strips. Alternatively—there may be no overlap between the different pairs of anti-parallel sensing strips.

There may be less than four or more than four pairs of anti-parallel sensing strips per MBMS.

The MBMS may include a series of independent pairs anti-parallel sensing strips in a row. Independent bending points can be monitored along the MBMS by the independent pairs of anti-parallel sensing trips whereas each pair of anti-parallel sensing strips may sense (independent from other pairs of anti-parallel sensing strips) a single bending point. In this manner, each bending point is detected and monitored by a different set of coupled anti-parallel sensing trips. When the size of the pairs of anti-parallel sensing strips fits the different bones of a finger the MBMS may accurately monitor the movement of the finger.

Figure 18:
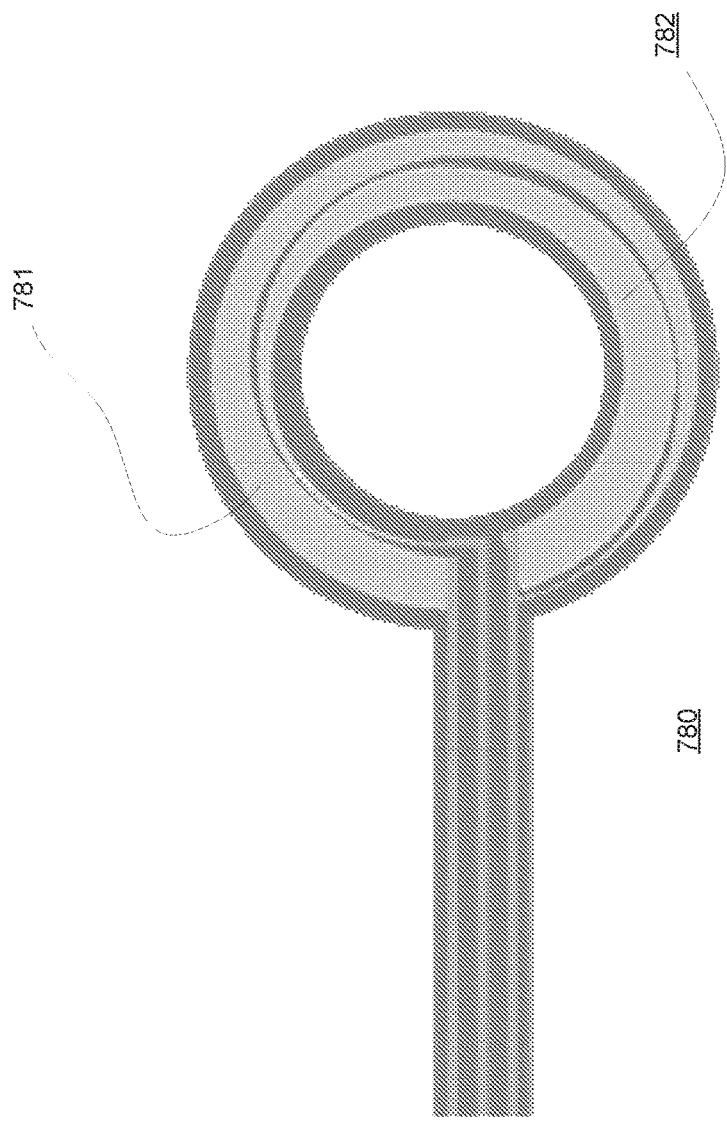
FIG. 18 illustrates a ring shaped sensing element according to an embodiment of the invention.

FIG. 18 illustrates a ring shaped sensing element 780 according to an embodiment of the invention.

In FIG. 18 the gradient is a width gradient that changes along the ring in a radial manner. The pair of anti-parallel sensing strips includes arc shaped strips 781 and 782.

In this way, the mean position of a touch point along the arched anti-parallel sensing strips can be calculated as well as the touch level/force according to the measured resistance of the two strips.

Figure 19:
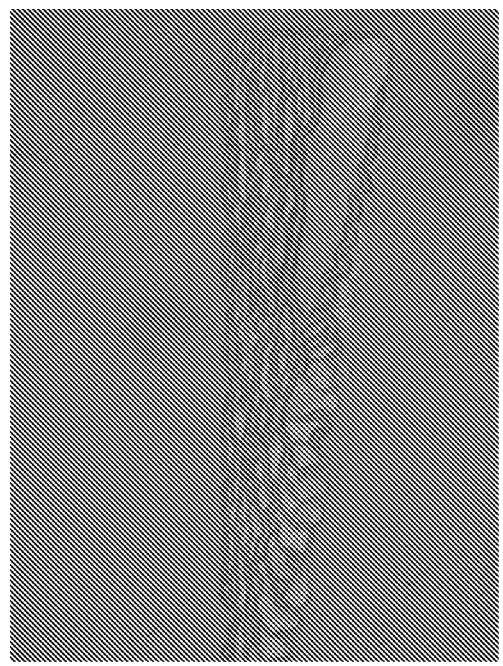
FIG. 19 illustrates a printed hexanethiol capped NP with width gradient according to an embodiment of the invention.

FIG. 19 illustrates a printed hexanethiol capped NP 790 with width gradient according to an embodiment of the invention.

Figure 20:
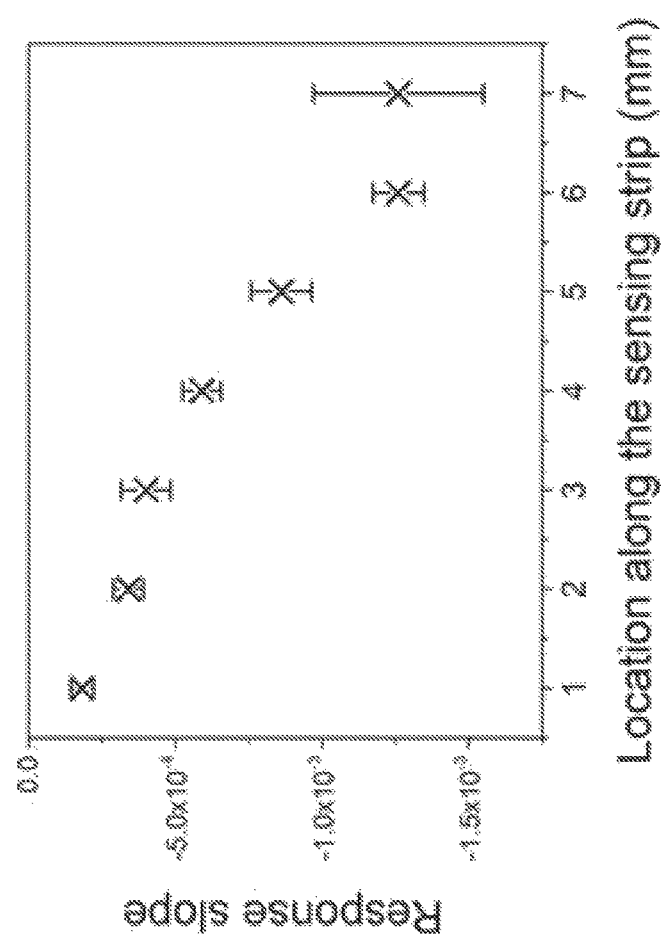
FIG. 20 illustrates a sensitivity of a width gradient sensor to constant speed strain as a function of the location along the sensing strip according to an embodiment of the invention.

FIG. 20 includes graph 800 that illustrates a sensitivity of a width gradient sensor to constant speed strain (1.5 mm/sec) as a function of the location along the sensing strip according to an embodiment of the invention.

Figure 21:
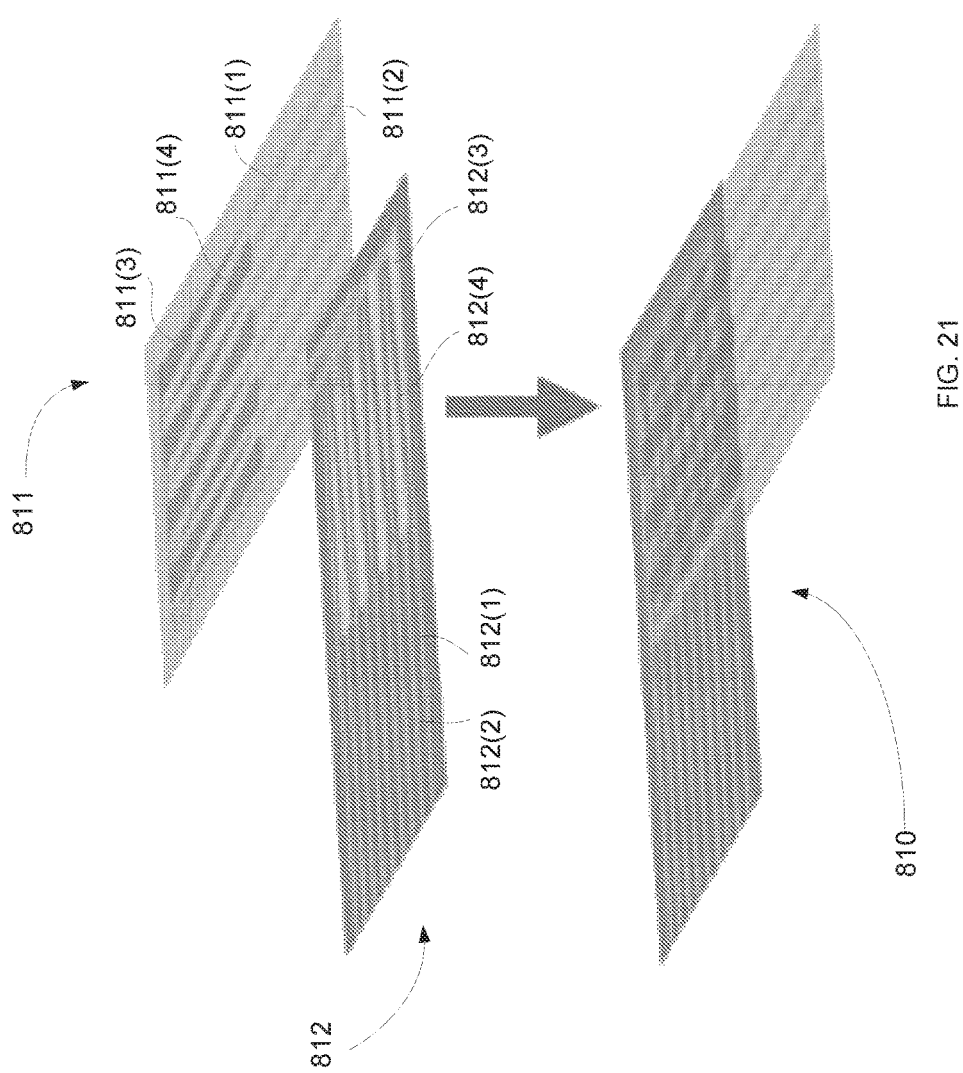
FIG. 21 illustrates two layers of a two dimensional array in which the gradient is a width gradient according to an embodiment of the invention.

FIG. 21 illustrates two layers 811 and 812 of a two dimensional array 810 in which the gradient is a width gradient according to an embodiment of the invention.

FIG. 21 illustrates the pairs of the sensing strips as well as the conductors that are coupled to the sensing strips.

For example, see conductors 811(1) and 811(2) of first layer 811 that are coupled to a pair of anti-parallel sensing strips 811(3) and 811(4) respectively.

For example, see conductors 812(1) and 812(2) of second layer 812 that are coupled to a pair of anti-parallel sensing strips 812(3) and 812(4) respectively.

The pairs of anti-parallel sensing strips of the first layer are orthogonal to the pairs of anti-parallel sensing strips of the second layer.

According to various embodiment of the invention the pressure sensing device may be included in and/or coupled to and/or attached to computerized devices such as computers, robots and smart objects.

The pressure sensing device may provide an interfacing and/or sensing means for sensing touch, enabling the computerized device to "feel" their surroundings.

Touch sensation provided by the pressure sensing device may provide the computerized device direct information on the contact between the computerized device and whatever comes into contact with it, enabling almost instant feedback on the nature of the contact (e.g. magnitude, location, dynamics, stiffness and even texture).

The pressure sensing device may be embedded in various elements such as but not limited to tactile smart patches that will allow computerized devices to feel the interaction with their surroundings Non-limiting example of fields of use and/or applications that may benefit from the pressure sensing device include:

Force mapping strips/patches

Analog touch-screens or touch pads (that add the dimension of touch magnitude)

Touch sensitive medical devices/tools (for example, first insertion needle in laparotomy) that might help surgeons monitor the feel of tissues and organs.

Touch-sensitive robots

Prosthetic limbs with tactile feedback that retain the sense of touch to amputees.

Slipping threshold sensors for robotic (or prosthetic) clamps/hands that enable the robot (or amputee) to identify the slipping threshold between the clamping fingers and the object and adjust the force applied by the clamp on the object to be above the slipping threshold (and not under).

Smart sports gear (grasp/impact monitoring).

Physiotherapy and rehabilitation smart glove/patch (movement and grasp monitoring).

Large area strain monitoring for crack and structural deformation detection in air and spacecraft.

Interactive Objects that React to Touch

Lighting controller/switch (e.g. wearable RGB LED strips that are independently controlled by a smart strip, where one end is the red edge of the spectrum and the other end is the blue/purple edge of the spectrum, and the intensity is controlled according to the magnitude of the applied users finger force).

Sampled sound controller (e.g. a type of musical instrument that produces variations of a sampled sound, were the x axis defines the tone on the sound, the y axis defines the music scale, and the magnitude of the applied users finger force defines the intensity of the sound).

Track pitch/speed controlled that changes the pitch/speed momentarily or constantly, in a manner similar to the jog or the pitch adjuster on a CDJ device, respectively).

Wearable smartphone controller (embedded into a wearable garment or worn separately) for controlling key features, such as, but not limited to, answering an incoming call, ending a call, increasing or decreasing the smartphone output volume, skipping between tracks, scanning within a track).

Intensity control and/or function selector for universal devices (e.g. TV, AC, Video, Stereo, etc) with any 2D or 3D geometry (e.g. linear strip, ring, rectangle, cap etc).

Multirotor or multi-coper drone controller that enables the user to control the direction of flight of the drone and the upward or downward acceleration of the drone.

Signature pad that records the shape of the signature and the pressure applied by the hand on the pad during the course of writing of the signature.

Torque metering strip.

Pulse or hart beat monitoring patch.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A pressure sensing device, comprising:
a first and second sensing elements that comprise one or more piezoresistive materials;
wherein the first sensing element has a first gradient;
wherein the first sensing element comprises multiple first regions; wherein at an absence of a pressure applied on the first sensing element there is a one to one mapping between a given property of each first region and a location of the first region, wherein the given property is selected out of resistance and sensitivity;
wherein the second sensing element has a second gradient;
wherein the second gradient differs from the first gradient;
wherein a sensing circuit that is coupled to the first and second sensing elements, is arranged to sense at least one out of resistance or conductance of the first and second sensing elements and to determine at least one out of a location or a magnitude of a pressure applied on the first and second sensing elements.

2. The pressure sensing device according to claim 1 wherein the one or more piezoresistive materials are selected from a group consisting of electrically conductive nanoparticles, nanotubes, nanowires, carbon nanotubes, carbon nanowires, and a combination thereof.

3. The pressure sensing device according to claim 1 wherein at least one of the first and second gradients is selected from a group consisting of a thickness gradient, a width gradient, a concentration gradient, a resistance gradient, a sensitivity to strain gradient, a capping layer thickness gradient, and a combination thereof.

4. The pressure sensing device according to claim 1, wherein the first and second gradients facilitate a determination of the magnitude and the location of the pressure applied on the first and second sensing elements.

5. The pressure sensing device according to claim 1 wherein the first sensing element comprises multiple first regions; wherein at an absence of a pressure applied on the first sensing element there is a one to one mapping between a given property of each first region and a location of the first region wherein the given property is selected out of resistance and sensitivity.

6. The pressure sensing device according to claim 1 wherein the second sensing element composes multiple second regions; wherein at an absence of a pressure applied on the second sensing element there is a one to one mapping between a given property of each second region and a location of the second region, wherein the given property is selected out of resistance and sensitivity.

7. The pressure sensing device according to claim 6 wherein the first sensing element comprises multiple first regions wherein at an absence of a pressure applied on the first sensing element there is a one to one mapping between a given property of each first region and a location of the first region, wherein the one to one mapping between the given property of each first region and the location of the first region represents a change in values of the given property of the first sensing element along a first direction, wherein the one to one mapping between the given property of the second region and the location of the second region represents a change in values of the given property of the second sensing element along a second direction that is opposite to the first direction.

8. The pressure sensing device according to claim 1 wherein the first gradient has a direction that is opposite to a direction of the second gradient.

9. The pressure sensing device according to claim 1 wherein the first sensing element has a length, and wherein the sensing circuit is arranged to determine the location at a spatial resolution that is a fraction of the length of the first sensing element.

10. The pressure sensing device according to claim 1 wherein the first sensing element has a length, and wherein the sensing circuit is arranged to determine the location at a spatial resolution that is less than one percent of the length of the first sensing element.

11. The pressure sensing device according to claim 1 wherein the sensing circuit is arranged to determine only the location of the pressure applied on the first and second sensing elements.

12. The pressure sensing device according to claim 1 wherein the sensing circuit is arranged to determine only the magnitude of the pressure applied on the first and second sensing elements.

13. The pressure sensing device according to claim 1 wherein at least one of the first and second gradients is a thickness gradient.

14. The pressure sensing device according to claim 1 wherein at least one of the first and second gradients is a concentration gradient.

15. The pressure sensing device according to claim 1 wherein at least one of the first and second gradients is a sensitivity to strain gradient.

16. The pressure sensing device according to claim 1 wherein at least one of the first and second gradients is a capping layer thickness gradient.

17. The pressure sensing device according to claim 1 wherein at least one of the first and second gradients is a combination of at least two out of a thickness gradient, a width gradient, a concentration gradient, a resistance gradient, a sensitivity to strain gradient, and a capping layer thickness gradient.

18. The pressure sensing device according to claim 1 wherein the given property is a resistance.

19. The pressure sensing device according to claim 1 wherein the given property is a sensitivity.

* * * * *